(12) United States Patent
Wilhite et al.

(10) Patent No.: US 8,059,777 B2
(45) Date of Patent: Nov. 15, 2011

(54) METHOD AND APPARATUS FOR GENERATING PHASE SHIFTED LOCAL OSCILLATOR SIGNALS FOR A FEEDBACK LOOP ON A TRANSMITTER

(75) Inventors: Jeffrey B. Wilhite, Barrington, IL (US); Paul H. Gailus, Prospect Heights, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 958 days.

(21) Appl. No.: 11/941,281

(22) Filed: Nov. 16, 2007

(65) Prior Publication Data
US 2009/0129446 A1    May 21, 2009

(51) Int. Cl.
*H03D 3/24* (2006.01)
(52) U.S. Cl. ........ 375/376; 375/373; 375/371; 375/354; 375/219; 375/295; 375/316; 455/126; 327/156; 327/147
(58) Field of Classification Search .......... 375/376, 375/373, 371, 354, 219, 295, 316; 455/126, 455/127; 327/156, 147
See application file for complete search history.

(56) References Cited

U.S. PATENT DOCUMENTS

| | | | |
|---|---|---|---|
| 5,066,923 A | 11/1991 | Gailus et al. | |
| 6,963,620 B2 | 11/2005 | Lee et al. | |
| 7,203,251 B2 | 4/2007 | Kim et al. | |
| 2007/0279109 A1* | 12/2007 | Kirschenmann | 327/156 |

OTHER PUBLICATIONS

PCT/US2008/081007—International Search Report and Written Opinion Mailed Jun. 3, 2009—12 pages.

* cited by examiner

*Primary Examiner* — Dac Ha
*Assistant Examiner* — Zewdu Kassa
(74) *Attorney, Agent, or Firm* — Barbara R. Doutre

(57) ABSTRACT

A transmitter is provided with a local oscillator (LO) processing unit to maintain stability in the transmitter's feedback loop. The LO processing unit includes at least one delay locked loop (DLL) and a programmable divider to generate phase shifted LO signals for adjusting a loop phase of the feedback loop in the transmitter. The generated phase shifted LO signals are of both a coarse and fine phase shifted nature. The adjustability and control of the coarse and fine phase shifting of the LO signals maintains linearity in the transmitter feedback loop.

11 Claims, 11 Drawing Sheets

METHOD AND APPARATUS FOR GENERATING PHASE SHIFTED LOCAL OSCILLATOR SIGNALS FOR A FEEDBACK LOOP ON A TRANSMITTER

FIELD OF THE INVENTION

The present disclosure relates generally to a feedback loop in a transmitter and more particularly to method and apparatus for generating phase shifted local oscillator signals for a feedback loop in a transmitter.

BACKGROUND

Linear transmitters are known and are widely used in today's information age. A Cartesian feedback transmitter constitutes one such known transmitter. A Cartesian feedback loop is used to compensate for nonlinearities in a power amplifier of a Cartesian feedback transmitter. Loop phase of the Cartesian feedback loop must be properly adjusted; if not, the Cartesian feedback transmitter linearity may suffer. At worst, the feedback of the Cartesian feedback loop may function in a positive mode, causing undesirable oscillations.

One approach for adjusting phase within the Cartesian feedback loop employs a frequency domain technique. The frequency domain technique uses complex frequency mixers and quadrature generators to generate a phase shifted local oscillator (LO) signal, which introduces a controlled phase shift into the Cartesian feedback loop. The frequency domain technique uses mixers to mix sine and cosine components with a LO signal to shift the phase of the LO signal.

While the frequency domain technique has been effective, there are some limitations which still persist. First, due to harmonics created by phase shifting circuitry, filtering is required in the LO signal path to enable the transmitter to operate in a stable mode over multiple frequency bands. The wider the range of frequencies over which the transmitter is required to operate, the more filter components are required, which consumes space and current drain and adds complexity to the transmitter circuit.

Therefore, as we move towards multiple mode and multi-band technology, such as the next generation software definable radios; there is a need for an improved method and apparatus for generating phase shifted local oscillator signals for a feedback loop in a transmitter.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the invention.

Figure 1:
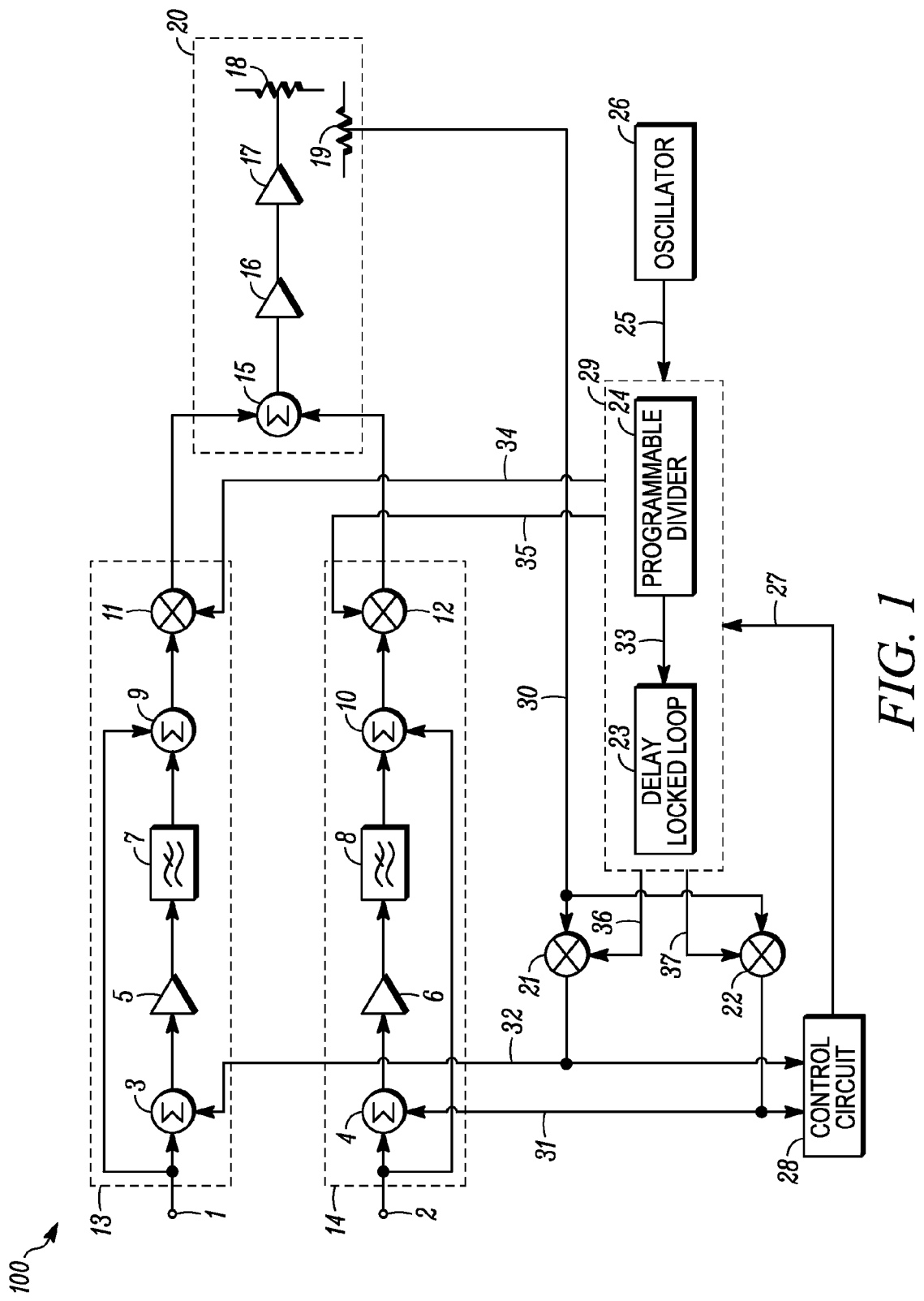
FIG. 1 is a block diagram of a transmitter in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Before describing in detail embodiments that are in accordance with the invention, it should be observed that the embodiments reside primarily in combinations of method steps and apparatus components for generating phase shifted local oscillator signals for a feedback loop in a transmitter. Accordingly, the apparatus components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

In this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. A device or structure that is "configured" in a certain way is configured in at least that way, but may also be configured in ways that are not listed.

Various embodiments of the invention provide a method and apparatus for generating phase shifted local oscillator signals for a feedback loop in a transmitter. The transmitter includes at least one delay locked loop (DLL) and a programmable divider. The method includes receiving a local oscillator (LO) signal and a phase control signal by a LO processing unit. The LO processing unit comprises the programmable divider and the DLL. The method further includes generating a first phase shifted LO signal and a second phase shifted LO signal. In one example, the programmable divider may generate the first phase shifted LO signal and the second phase shifted LO signal. The second phase shifted LO signal is in phase quadrature to the first phase shifted LO signal. The first phase shifted LO signal and the second phase shifted LO signals are then applied to a modulator. Further, a third phase shifted LO signal having a coarse phase shift is generated and this third phase shifted LO signal is then phase shifted to generate fine phase shifted LO signals, each of the fine phase shifted LO signals having a fine phase shift. Thereafter, a first fine phase shifted LO signal and a second fine phase shifted LO signal are selected of the fine phase shifted LO signals, whereby the second fine phase shifted LO signal is in phase quadrature to the first fine phase shifted LO signal. The first fine phase shifted LO signal and a second fine phase shifted LO signal are then applied to a demodulator.

Generally speaking, in accordance with some embodiments, the invention relates to adjusting a loop phase of the feedback loop in the transmitter to maintain linearity of the transmitter over a broad range of frequencies. The feedback loop is generally defined to be a circuit that feeds back a portion of an output to an input of a system. In one example, the feedback loop may be a Cartesian feedback loop, whereby the Cartesian feedback loop maintains linearity of the transmitter.

Referring now to the drawings and in particular to FIG. 1, there is shown a block diagram of a transmitter 100 in accordance with some embodiments. The transmitter 100 includes generally a first information signal path 13 and a second information signal path 14, a combined information signal path 20, an oscillator 26, a local oscillator (LO) processing unit 29 comprising a programmable divider 24 and a delay locked loop (DLL) 23, a pair of mixers 21 and 22, and a control circuit 28. In the embodiments of the invention, the first information signal path 13 and the second information signal path 14 are identical to one another. The only difference between the two lies in the fact that the first information signal path 13 receives an inphase input signal 1, whereas the second information signal path 14 receives a quadrature input signal 2.

The first information signal path 13 includes a differential summer 3, a variable gain baseband amplifier 5, a low pass filter 7, a summer 9, and a mixer 11. Similarly, the second information signal path 14 includes a differential summer 4, a variable gain baseband amplifier 6, a low pass filter 8, a summer 10, and a mixer 12. In one example, the mixers 11 and 12 may also be known as upmixers 11 and 12. Operationally, in the first information signal path 13, the differential summer 3 receives the inphase input signal 1 and a down-converted signal 32 from the mixer 21. The output signal from the differential summer 3 is fed to the variable gain baseband amplifier 5 that further passes through the low pass filter 7 to the summer 9. The inphase input signal 1 is fed as the remaining input to this summer 9 to support open loop operation performed during a training mode. The output of the summer 9 is then received by the mixer 11. The mixer 11 mixes the output of the summer 9 along with an output 34 of the LO processing unit 29 to up-convert the incoming baseband signal to a predetermined carrier frequency of choice. It will be apparent to a person with ordinary skill in the art that the second information signal path 14 will operationally work in a similar fashion to that of the first information signal path 13.

The output signals from both the information signal paths 13 and 14 are fed to the inputs of a summer 15. The inputs to the summer 15 represent the inputs to the combined information signal path 20. The combined information signal path 20 includes the summer 15, an exciter 16, a power amplifier 17, an appropriate output element 18, and a coupler 19. Operationally, the output of the summer 15 is fed as an input of the exciter 16 and then through the power amplifier 17 to the appropriate output element 18. The coupler 19, responsive to the output of the power amplifier 17, provides a feedback signal 30 to the mixers 21 and 22. In one example, the mixers 21 and 22 may be known as downmixers 21 and 22 for down-converting the feedback signal 30 with the outputs of the LO processing unit 29 to generate the down-converted signals 31 and 32. The down-converted signals 31 and 32 are then provided to the subtractive inputs of the differential summers 3 and 4 to maintain linearity of the transmitter 100. In one example, the down-converted signal 31 may also be known as a quadrature demodulated signal 31. Similarly, the down-converted signal 32 may be known as an inphase demodulated signal 32.

The control circuit 28 receives the quadrature demodulated signal 31 and the inphase demodulated signal 32 as inputs towards generating a phase control signal 27. In one example, the control circuit 28 may include comparators to detect phase of the down-converted signals 31 and 32. In the embodiments of the invention, the control circuit 28 determines a phase value for controlling phase shifts in the LO processing unit 29. In one embodiment of the invention, the phase value is determined during the training mode using a training algorithm, such as but not limited to successive approximation algorithm. During the training mode the transmitter 100 operates in an open loop mode where the variable gain baseband amplifiers 5 and 6 are disabled, thereby effectively disabling the inputs from the low pass filters 7 and 8 to the summers 9 and 10. In this case, the summers 9 and 10 only receive the inphase input signal 1 and the quadrature input signal 2.

A feedback signal 30 coupled from a transmitter output signal via the coupler 19 under the training mode is then fed into the downmixers 21 and 22, along with the output signals 36 and 37 from the LO processing unit 29. The down-converted signals 31 and 32 obtained from the downmixers 21 and 22 during the training mode are then fed to the control circuit 28 for calculation of the phase value. In one example, the phase value controls a coarse phase shift in the programmable divider 24 and a fine phase shift in the DLL 23.

The LO processing unit 29 receives an input signal 25 from the oscillator 26 and the phase control signal 27 from the control circuit 28. The input signal 25 from the oscillator may also be known as a LO signal 25. In one embodiment of the invention, the oscillator 26 may be a voltage controlled oscillator 26. The LO signal 25 to the LO processing unit 29 may be at a frequency $f_{vco}=Xf_o$, where X is a multiple having an integer value and $f_o$ is a transmitter output signal frequency. In this case, the oscillator 26 operates at the frequency $f_{vco}$ obtained by the multiplication of the integer value "X" with the transmitter output signal frequency "$f_o$". In one example, the integer value "X" may be a multiple of 4, based on which two different outputs, i.e. injection signals 34 and 35 which are 90° out of phase with each other, may be selected from the programmable divider 24.

In the embodiments of the invention, the coarse phase shift may be a phase shift value which is within $360°/(f_{vco}/f_o)$ of the phase value determined during the training mode. By one approach the coarse phase shift may be within $$\frac{360°}{X}, \text{ where } X = \frac{f_{vco}}{f_o}$$

In the embodiments of the invention, the upmixers 11 and 12 mix the injection signals 34 and 35, generated respectively from the LO processing unit 29 with the baseband signals from the summers 9 and 10 respectively. In one example, the injection signal 34 may also be known as a first phase shifted LO signal 34. Similarly, the injection signal 35 may be known as a second phase shifted LO signal 35. According to one embodiment of the invention, the second phase shifted LO signal 35 is substantially in phase quadrature to the first phase shifted LO signal 34.

As illustrated in FIG. 1, according to one embodiment of the invention the programmable divider 24 is coupled between the oscillator 26 and the DLL 23. Generally speaking, the LO processing unit 29 receives the LO signal 25 from the oscillator 26 and generates phase shifted LO signals. Operationally, in the embodiments of the invention, the programmable divider 24 receives the LO signal 25 and generates the first phase shifted LO signal 34 and the second phase shifted LO signal 35. In one example, after receiving the LO signal 25 the programmable divider 24 modifies the frequency fvco of the LO signal 25 by a factor 1/X to generate a LO signal having a frequency $f_{vco}/X$. The first and the second phase shifted LO signals 34 and 35 are generated having the frequency $f_{vco}/X$ and a quadrature phase shift with respect to each other. In one example, the first phase shifted LO signal 34 may also be known as an inphase upmixer LO signal 34 and the second phase shifted LO signal 35 may also be known as a quadrature upmixer LO signal 35. It will be apparent to a person with ordinary skill in the art that the first phase shifted LO signal 34 may be known as a quadrature upmixer LO signal 34 and the second phase shifted LO signal 35 may be known as an inphase upmixer LO signal 35.

Further, in the embodiments of the invention, a third phase shifted LO signal 33 is generated from the programmable divider 24 by applying a coarse phase shift to the LO signal having the frequency $f_{vco}/X$. The third phase shifted LO signal 33 is then fed to the DLL 23, whereby the DLL 23 phase shifts the third phase shifted LO signal 33 to generate fine phase shifted LO signals. Each of the fine phase shifted LO signals have a fine phase shift. The DLL 23 then selects a first fine phase shifted LO signal 36 and a second fine phase shifted LO signal 37 having a quadrature phase shift with respect to each other. In one example, the two selected signals 36 and 37 are then fed to the downmixers 21 and 22 along with the feedback signal 30 coupled to the transmitter output signal via the coupler 19 to generate the inphase demodulated signal 32 and the quadrature demodulated signal 31. In one example, the first fine phase shifted LO signal 36 may also be known as an inphase downmixer LO signal 36 and the second fine phase shifted LO signal 37 may also be known as a quadrature downmixer LO signal 37. It will be apparent to a person with ordinary skill in the art that the first fine phase shifted LO signal 36 may also be known as a quadrature downmixer LO signal 36 and the second fine phase shifted LO signal 37 may also be known as an inphase downmixer LO signal 37.

Figure 2:
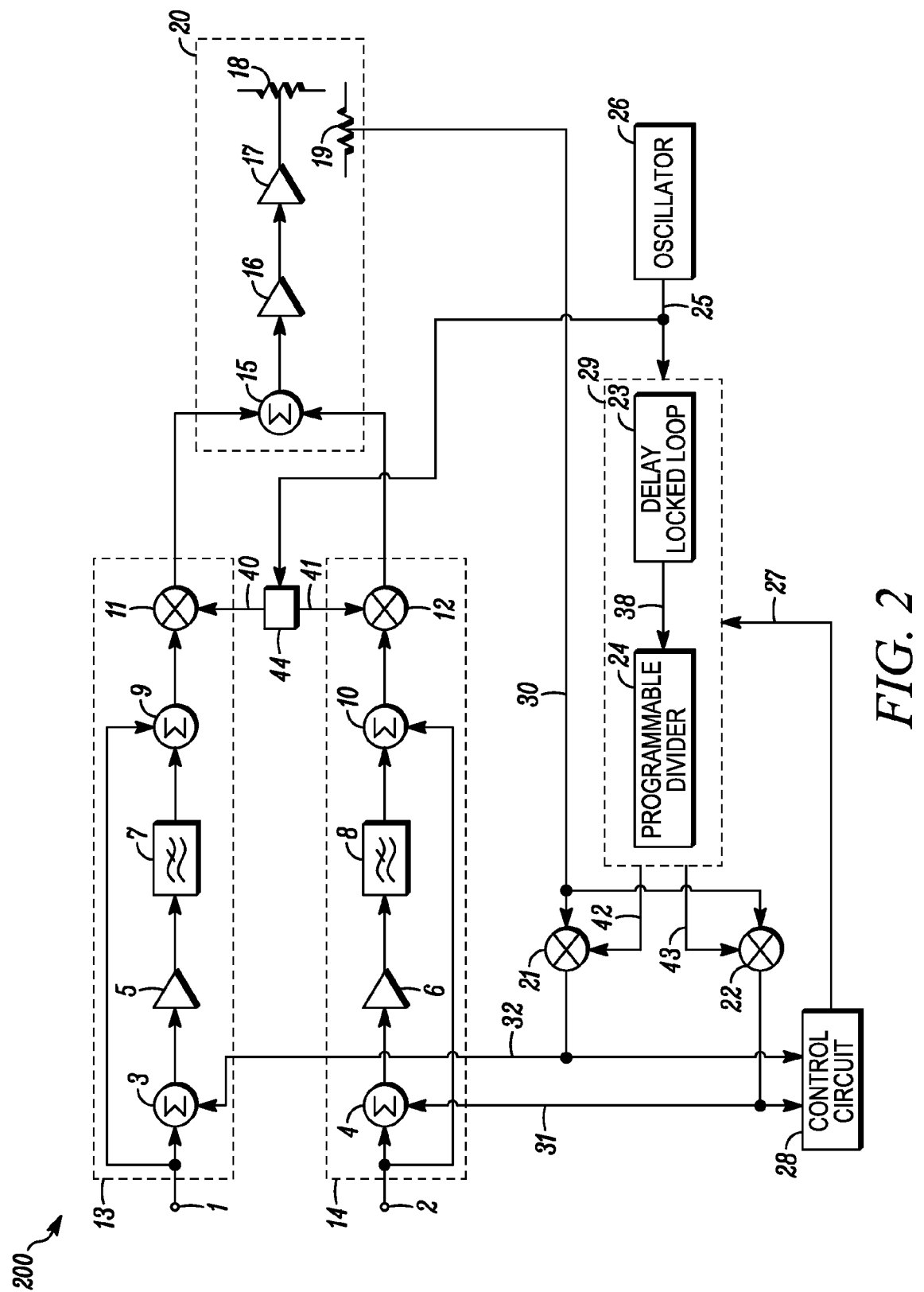
FIG. 2 is a block diagram of a transmitter in accordance with some embodiments.

According to FIG. 2, in accordance with another embodiment of the invention, a transmitter 200 includes the DLL 23 coupled between the oscillator 26 and the programmable divider 24. Operationally, in the transmitter 200 embodiment, the DLL 23 receives the LO signal 25 and generates a fine phase shifted LO signal 38. The fine phase shifted LO signal 38 is then fed into the programmable divider 24. In one example, after receiving the fine phase shifted LO signal 38 the programmable divider 24 modifies a frequency $f_{vco}$ of the fine phase shifted LO signal 38 by a factor 1/X to generate phase shifted signals having a frequency $f_{vco}/X$. Further, the programmable divider 24 applies a coarse phase shift to the fine phase shifted LO signal 38 to generate a first phase shifted LO signal 42 and a second phase shifted LO signal 43, both having the frequency $f_{vco}/X$. The first phase shifted LO signal 42 and the second phase shifted LO signal 43 may have a quadrature phase shift with respect to each other. In one example, the two generated signals 42 and 43 are then fed to the downmixers 21 and 22 along with the feedback signal 30 coupled to the transmitter output signal via the coupler 19 to generate the inphase demodulated signal 32 and the quadrature demodulated signal 31. In one example, the first phase shifted LO signal 42 may also be known as an inphase downmixer LO signal 42 and the second phase shifted LO signal 43 may also be known as a quadrature downmixer LO signal 43. It will be apparent to a person with ordinary skill in the art that the first phase shifted LO signal 42 may also be known as a quadrature downmixer LO signal 42 and the second phase shifted LO signal 43 may also be known as an inphase downmixer LO signal 43.

In the transmitter 200 embodiment, the transmitter 200 includes a quadrature generator 44 to receive the LO signal 25 from the oscillator 26. Operationally, after receiving the LO signal 25, the quadrature generator 44 modifies the frequency of the LO signal 25 by a factor 1/X. Further, the quadrature generator 44 generates an inphase LO signal 40 and a quadrature LO signal 41 having a frequency $f_{vco}/X$ and quadrature phase shifted with respect to each other. In this case, the quadrature generator 44 may also be replaced by a programmable divider 44, whereby the programmable divider 44 may modify the frequency of the LO signal 25 and generate the inphase LO signal 40 and the quadrature LO signal 41. The inphase LO signal 40 and the quadrature LO signal 41 then serve as inputs to the upmixers 11 and 12 respectively. The outputs from the upmixers 11 and 12 are then fed as inputs to the summer 15. In one example, the inphase LO signal 40 may also be known as an inphase upmixer LO signal 40 and the quadrature LO signal 41 may also be known as a quadrature upmixer LO signal 41.

Figure 3:
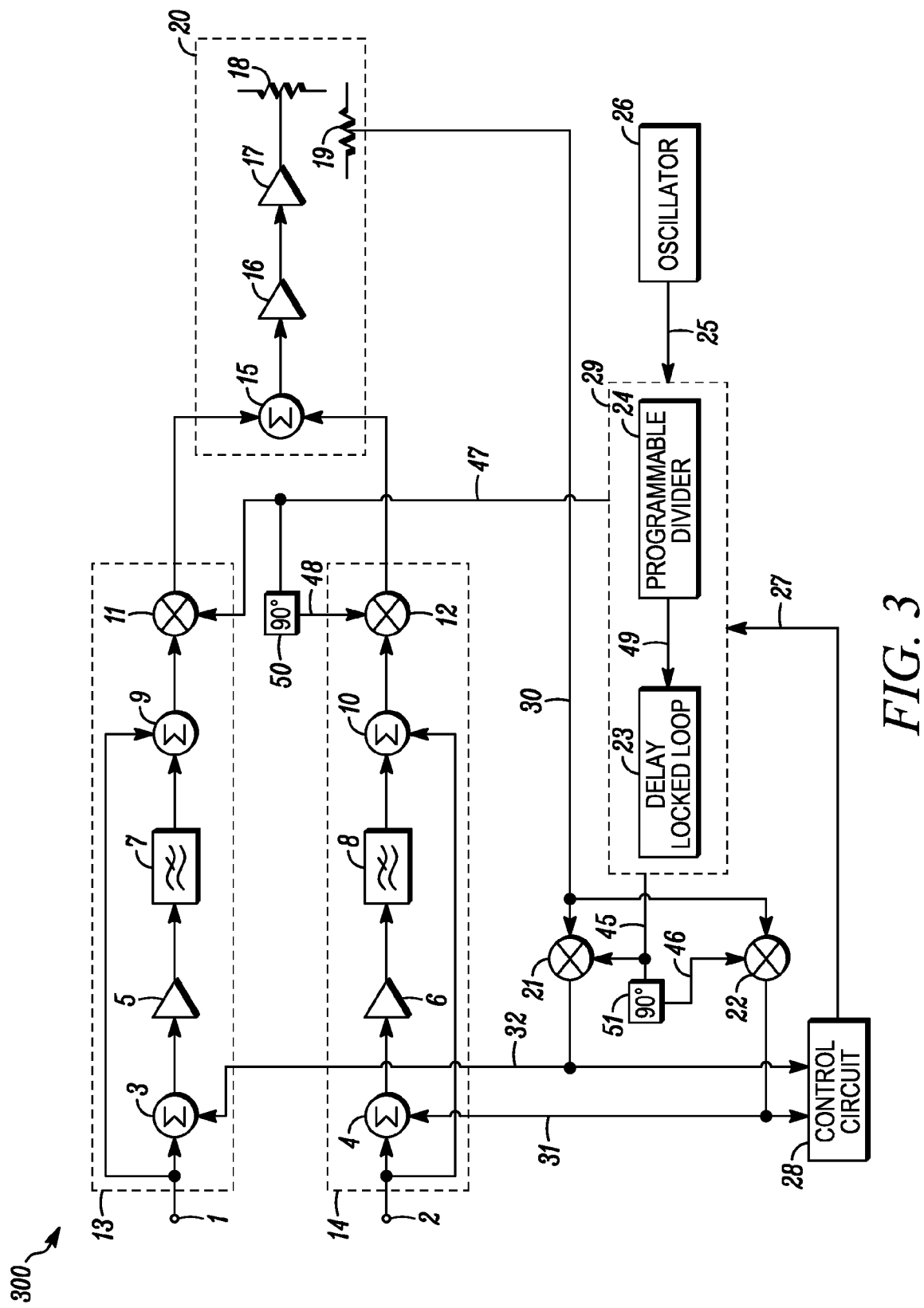
FIG. 3 is a block diagram of a transmitter in accordance with some embodiments.

According to FIG. 3, in accordance with another embodiment of the invention, a transmitter 300 includes the programmable divider 24 coupled between the oscillator 26 and the DLL 23 and also includes a first quadrature generator 50 coupled to the upmixer 12 and a second quadrature generator 51 coupled to the downmixer 22. Operationally, in the transmitter 300 embodiment, the programmable divider 24 receives the LO signal 25 from the oscillator 26 and modifies the frequency fvco of the LO signal 25 by a factor 1/X to generate a LO signal having a frequency $f_{vco}/X$. Further, the programmable divider 24 generates a first phase shifted LO signal 47 of the LO signal and applies the generated first phase shifted LO signal 47 to the first quadrature generator 50 and the upmixer 11. The first quadrature generator 50 phase shifts the first phase shifted LO signal 47 by applying a qaudrature phase shift and generates a second phase shifted LO signal 48. The second phase shifted LO signal 48 is then applied to the upmixer 12. The outputs from the upmixers 11 and 12 are then fed as inputs to the summer 15. In one example, the first phase shifted LO signal 47 may also be known as an inphase upmixer LO signal 47 and the second phase shifted LO signal 48 may also be known as a quadrature upmixer LO signal 48. It will be apparent to a person with ordinary skill in the art that the first phase shifted LO signal 47 may also be known as a quadrature upmixer LO signal 47 and the second phase shifted LO signal 48 may also be known as an inphase upmixer LO signal 48.

In the transmitter 300 embodiment, the programmable divider 24 also generates a coarse phase shifted LO signal 49 by applying the coarse phase shift to the LO signal having the frequency $f_{vco}/X$. The coarse phase shifted LO signal 49 is then fed into the DLL 23, whereby the DLL 23 generates a first fine phase shifted LO signal 45 by applying the fine phase shift to the coarse phase shifted LO signal 49. The first fine phase shifted LO signal 45 is then fed into the second quadrature generator 51 and the downmixer 21. The second quadrature generator 51 phase shifts the first fine phase shifted LO signal 45 by applying a quadrature phase shift and generates a second fine phase shifted LO signal 46. In one example, the first fine phase shifted LO signal 45 may also be known as an inphase downmixer LO signal 45 and the second fine phase shifted LO signal 46 may also be known as a quadrature downmixer LO signal 46. It will be apparent to a person with ordinary skill in the art that the first fine phase shifted LO signal 45 may also be known as a quadrature downmixer LO signal 45 and the second fine phase shifted LO signal 46 may also be known as an inphase downmixer LO signal 46. In one example, the two generated signals 45 and 46 are then fed to the downmixers 21 and 22 along with the feedback signal 30 coupled from the transmitter output signal via the coupler 19 to generate the inphase demodulated signal 32 and the quadrature demodulated signal 31.

Figure 4:
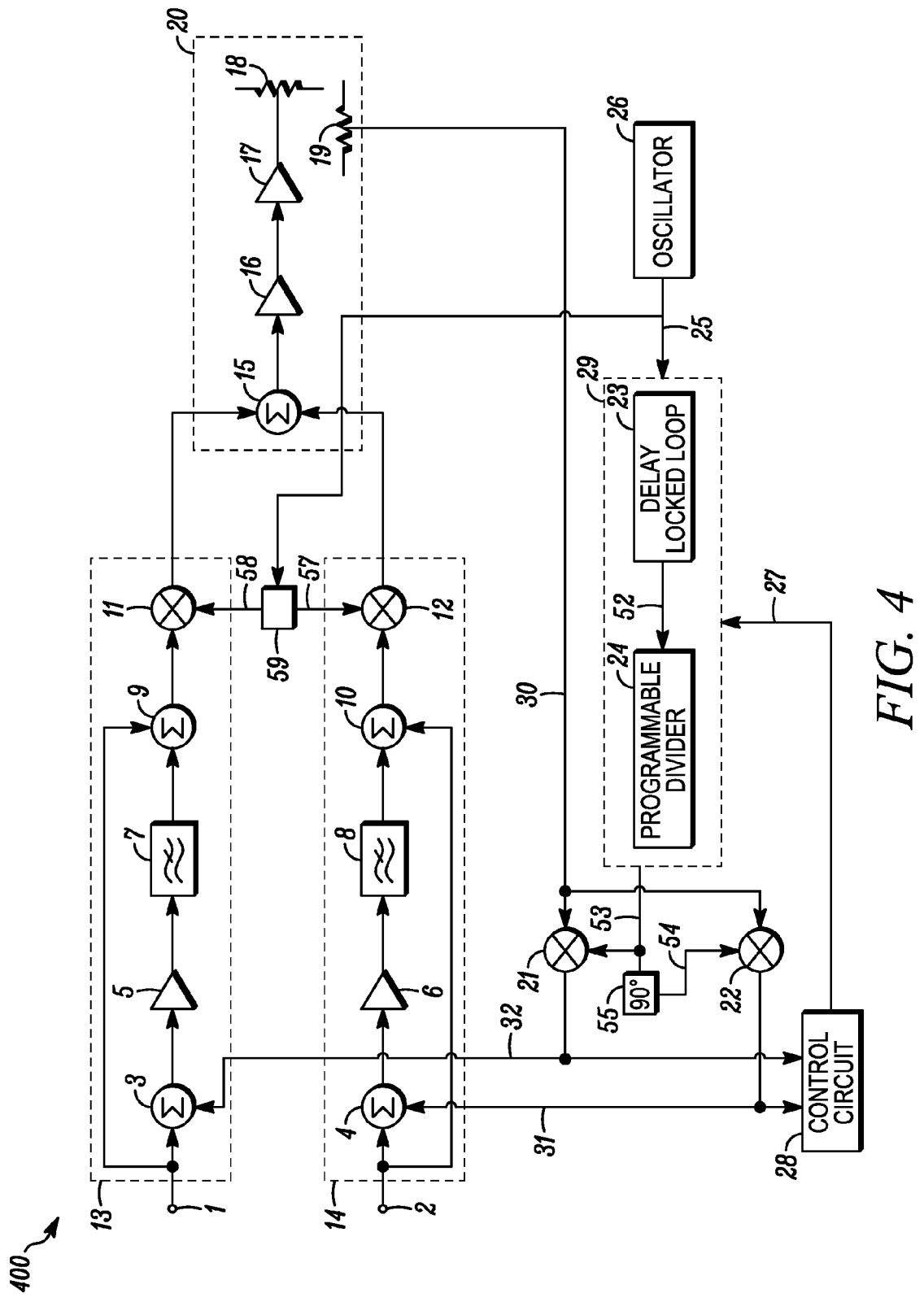
FIG. 4 is a block diagram of a transmitter in accordance with some embodiments.

According to FIG. 4, in accordance with another embodiment of the invention, a transmitter 400 includes the DLL 23 coupled between the oscillator 26 and the programmable divider 24. Operationally, in the transmitter 400 embodiment, the DLL 23 receives the LO signal 25 from the oscillator 26 and generates a fine phase shifted LO signal 52. The fine phase shifted LO signal 52 is then fed into the programmable divider 24. In one example, after receiving the fine phase shifted LO signal 52 the programmable divider 24 modifies a frequency $f_{vco}$ of the fine phase shifted LO signal 52 by a factor 1/X to generate phase shifted signals having a frequency $f_{vco}/X$. Further, the programmable divider 24 applies the coarse phase shift to the fine phase shifted LO signal 52 to generate a first phase shifted LO signal 53. The first phase shifted LO signal 53 is then applied to the second quadrature generator 55. The second quadrature generator 55 phase shifts the first phase shifted LO signal 53 by applying a quadrature phase shift and generates a second phase shifted LO signal 54. In one example, the first phase shifted LO signal 53 may also be known as an inphase downmixer LO signal 53 and the second phase shifted LO signal 54 may also be known as a quadrature downmixer LO signal 54. It will be apparent to a person with ordinary skill in the art that the first phase shifted LO signal 53 may also be known as a quadrature downmixer LO signal 53 and the second phase shifted LO signal 54 may also be known as an inphase downmixer LO signal 54. In this case, the two generated signals 53 and 54 are then fed to the downmixers 21 and 22 along with the feedback signal 30 coupled to the transmitter output signal via the coupler 19 to generate the inphase demodulated signal 32 and the quadrature demodulated signal 31.

The LO signal 25 is applied to the first quadrature generator 59. In one example, the first quadrature generator 59 modifies the frequency of the LO signal 25 by a factor 1/X. Further, the first quadrature generator 59 generates an inphase LO signal 58 and a quadrature LO signal 57 having a frequency $f_{vco}/X$ and quadrature phase shifted with respect to each other. In this case the first quadrature generator 59 may also be replaced by a programmable divider 59, whereby the programmable divider 59 may modify the frequency of the LO signal 25 and generate the inphase LO signal 58 and the quadrature LO signal 57. The inphase LO signal 58 and the quadrature LO signal 57 then serve as inputs to the upmixers 11 and 12 respectively. The outputs from the upmixers 11 and 12 are then fed as inputs to the summer 15. In one example, the inphase LO signal 58 may also be known as an inphase upmixer LO signal 58 and the quadrature LO signal 57 may also be known as a quadrature upmixer LO signal 57. It will be apparent to a person with ordinary skill in the art that the inphase LO signal 58 may also be known as a quadrature upmixer LO signal 58 and the quadrature LO signal 57 may also be known as an inphase upmixer LO signal 57.

In accordance with another embodiment of the invention, the LO processing unit 29 may comprise a programmable divider, a first DLL and a second DLL. In this embodiment the programmable divider may generate a first phase shifted LO signal for the upmixer 11 and a second phase shifted LO signal for the upmixer 12, whereby the first phase shifted LO signal and second phase shifted LO signal are in phase quadrature with respect to each other. Further, the programmable divider may generate a third phase shifted LO signal and a fourth phase shifted LO signal. The third phase shifted LO signal and the fourth phase shifted LO signal have a coarse phase shift and are in phase quadrature with respect to each other. In one example, the third phase shifted LO signal may be fed into the first DLL and the fourth phase shifted LO signal may be fed into the second DLL. In this case, both the DLLs may apply the fine phase shift to the third phase shifted LO signal and the fourth phase shifted LO signal. After fine phase shifting, the first DLL may produce a first fine phase shifted LO signal and the second DLL may produce a second fine phase shifted LO signal. The first fine phase shifted LO signal may be fed into the downmixer 21. The second fine phase shifted LO signal may be fed into the downmixer 22.

Figure 5:
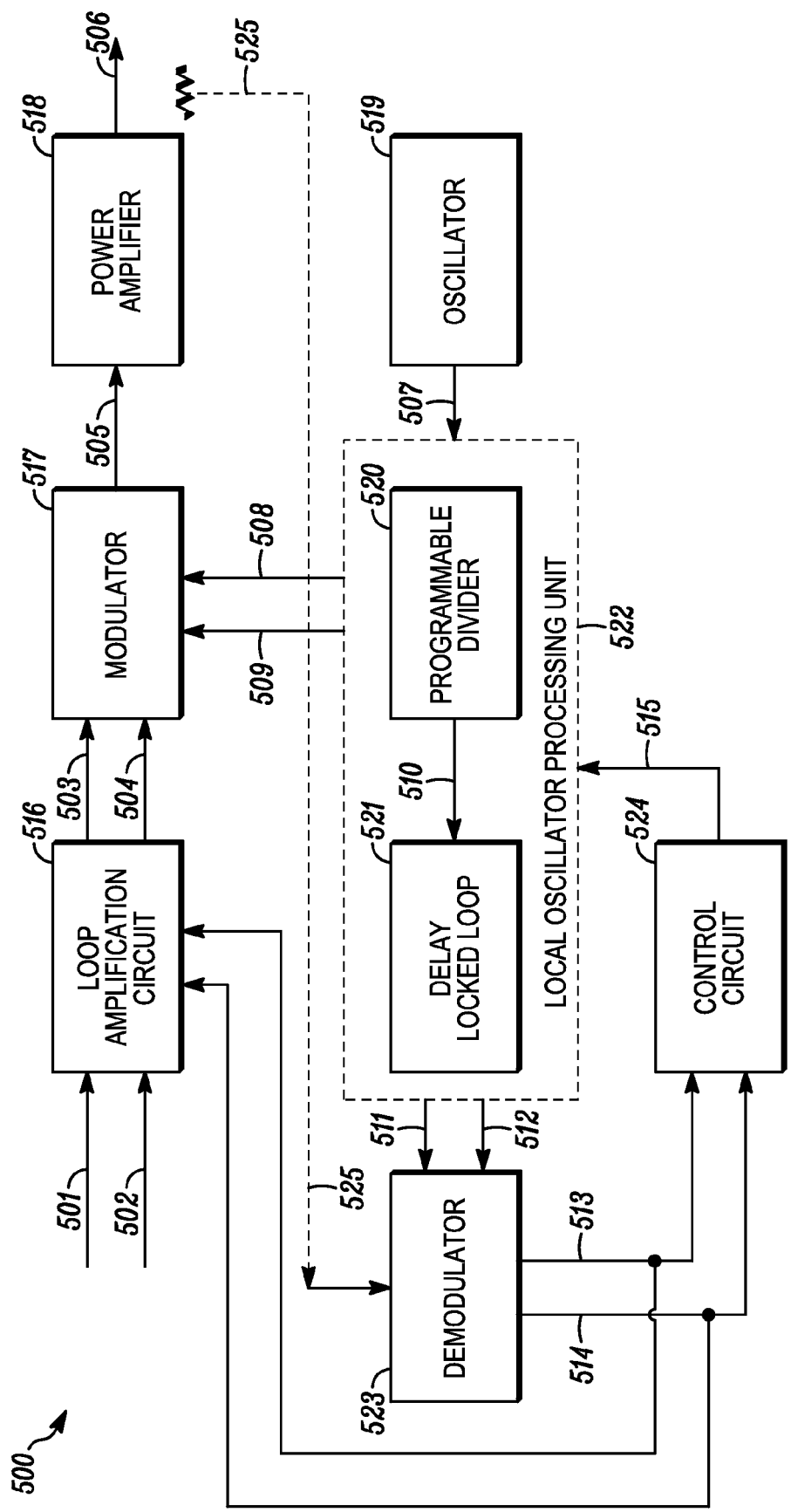
FIG. 5 is a simplified block diagram of FIG. 1 in accordance with some embodiments.

Referring now to FIG. 5, there is shown a transmitter 500 representing a simplified block diagram of the transmitter of FIG. 1 in accordance with some embodiments. The transmitter 500 includes a loop amplification circuit 516, a modulator 517, a power amplifier 518, an oscillator 519, a local oscillator (LO) processing unit 522 comprising a programmable divider 520 and a delay locked loop (DLL) 521, a demodulator 523, and a control circuit 524. The simplified block diagram of the transmitter of FIG. 1 will be described for illustration purposes. However, it will be apparent to a person with ordinary skill in the art that the components and their function described in the simplified block diagram may also be described in accordance to other embodiments of the invention.

The loop amplification circuit 516 receives an inphase input signal 501 and a quadrature input signal 502 along with an inphase demodulated signal 513 and a quadrature demodulated signal 514 to generate a loop amplified inphase signal 503 and a loop amplified quadrature signal 504. In one example, the loop amplification circuit 516 comprises the first information signal path 13, excluding the upmixer 11 and the second information signal path 14, excluding the upmixer 12 from previous embodiments.

The loop amplified inphase signal 503 and the loop amplified quadrature signal 504 are then fed into the modulator 517 along with a first phase shifted LO signal 508 and a second phase shifted LO signal 509 to generate a modulated output signal 505. In one example, the modulator 517 up-converts the loop amplified inphase signal 503 and the loop amplified quadrature signal 504 using the first phase shifted LO signal 508 and the second phase shifted LO signal 509 and combines the upconverted signals to generate the modulated output signal 505. In one example, the modulator 517 may include the upmixer 11, the upmixer 12, and the summer 15, as seen in previous embodiments.

The modulated output signal 505 is further fed into the power amplifier 518 to generate an amplified transmitter output signal 506. In one example the power amplifier may include the exciter 16 and the power amplifier 17, as seen in previous embodiments.

A feedback signal 525 coupled from the transmitter output signal 506 is then fed into the demodulator 523 along with a first fine phase shifted signal 511 and a second fine phase shifted signal 512 to generate the inphase demodulated signal 513 and the quadrature demodulated signal 514. The demodulator 523 downconverts the feedback signal 525 coupled from the transmitter output signal 506 using the first fine phase shifted signal 511 and the second fine phase shifted signal 512 to generate the inphase demodulated signal 513 and the quadrature demodulated signal 514. In one example, the demodulator may include the downmixer 21 and the downmixer 22, as seen in previous embodiments.

Further, the inphase demodulated signal 513 and the quadrature demodulated signal 514 are fed into the control circuit 524 for generating a phase control signal 515. In one example, the control circuit 524 may determine a phase shift value during the training mode based upon the inphase demodulated signal 513 and the quadrature demodulated signal 514.

The LO processing unit 522 receives the phase control signal 515 along with a LO signal 507 from the oscillator 519 to generate phase shifted LO signals for loop stability of the transmitter 100. In one example, the programmable divider 520 and the DLL 521 are provided in a path between the modulator 517 and the demodulator 523. In this embodiment, the programmable divider 520 may modify a frequency of the LO signal 507 and apply a coarse phase shift to the LO signal 507 to generate a coarse phase shifted LO signal 510. The coarse phase shifted LO signal 510 is then fed to a DLL 521. The DLL 521 may then apply a fine phase shift to the coarse phase shifted signal 510 to generate the first fine phase shifted LO signal 511 and the second fine phase shifted LO signal 512. The first fine phase shifted LO signal 511 and the second fine phase shifted LO signal 512 may be in quadrature phase shift with respect to each other. In one example, the first fine phase shifted LO signal 511 may also be known as an inphase downmixer LO signal 511 and the second fine phase shifted LO signal 512 may also be known as a quadrature downmixer LO signal 512. It will be apparent to a person with ordinary skills in the art that the first fine phase shifted LO signal 511 may also be known as a quadrature downmixer LO signal 511 and the second fine phase shifted LO signal 512 may also be known as an inphase downmixer LO signal 512.

In the embodiment of FIG. 5, the programmable divider 520 also generates the first phase shifted LO signal 508 and the second phase shifted LO signal 509. The first phase shifted LO signal 508 and the second phase shifted LO signal 509 may be in quadrature phase shift with respect to each other. In one example, the first phase shifted LO signal 508 may also be known as an inphase upmixer LO signal 508 and the second phase shifted LO signal 509 may also be known as a quadrature upmixer LO signal 509. It will be apparent to a person with ordinary skills in the art that the first phase shifted LO signal 508 may also be known as a quadrature upmixer LO signal 508 and the second phase shifted LO signal 509 may also be known as an inphase upmixer LO signal 509.

Figure 6:
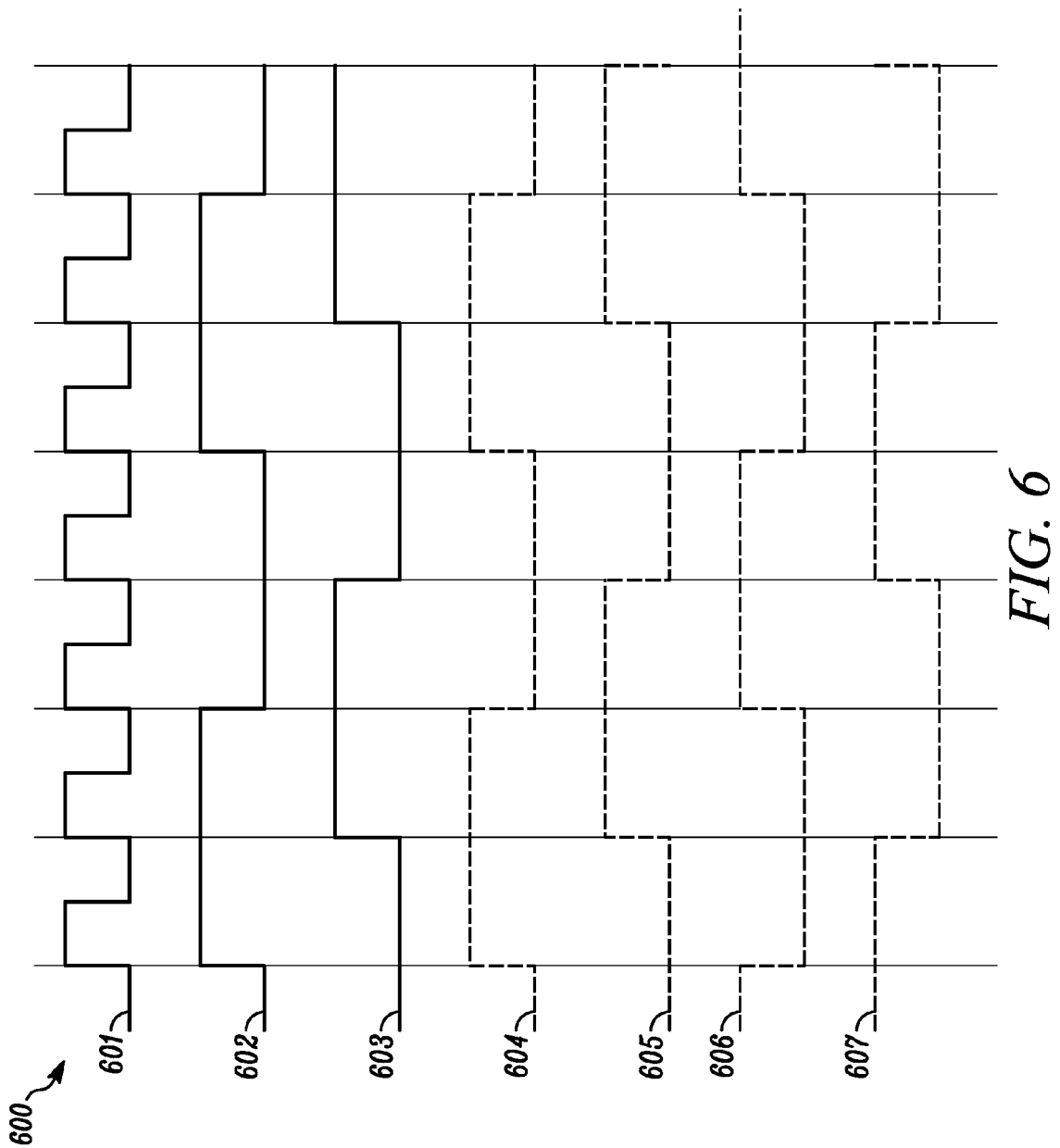
FIG. 6 is a timing diagram in accordance with some embodiments.

Referring now to FIG. 6, there is shown a timing diagram 600 in accordance with some embodiments that represents a waveform 601 for a LO signal, a waveform 602 of an inphase upmixer LO signal, a waveform 603 for a quadrature upmixer LO signal, and waveforms 604, 605, 606, and 607 for coarse phase shifted LO signals.

The waveform 601 is at a frequency $f_{vco}=Xf_o$, where X is a multiple having an integer value and $f_o$ is the transmitter output signal frequency from the appropriate output element 18. In the embodiment of FIG. 6, the waveform 601 is at four times the transmitter output signal frequency. In one example, the waveform 601 is generated by the oscillator 26 and is fed into the LO processing unit 29 of previous embodiments. In this case, the waveform 601 is fed into the programmable divider 24 of previous embodiments for generating phase shifted LO signals.

The waveform 602 and the waveform 603 are generated by the programmable divider 24. The waveform 602 and the waveform 603 are in quadrature phase shift with respect to each other. The waveform 602 and the waveform 603 are at a frequency $f_o$, where $f_o$ is the transmitter output signal frequency. In one example, the waveform 602 is fed into the upmixer 11 and the waveform 603 is fed into the upmixer 12 of previous embodiments.

Waveforms 604, 605, 606 and 607 depict a coarse phase shifted LO signal which may be generated by the programmable divider 24 according to this embodiment. The waveform 604 has the same phase as the waveform 602. The waveform 605 is 90 degrees phase shifted with respect to the waveform 602. The waveform 606 is 180 degrees phase shifted with respect to the waveform 602. The waveform 607 is 270 degrees phase shifted with respect to the waveform 602. In the embodiment of FIG. 6, one of the waveforms 604, 605, 606 and 607 may be selected as the coarse phase shifted LO signal based on the phase value determined during the training mode. In one example, the coarse phase shifted LO signal is fed into the DLL 23 of previous embodiments.

Figure 7:
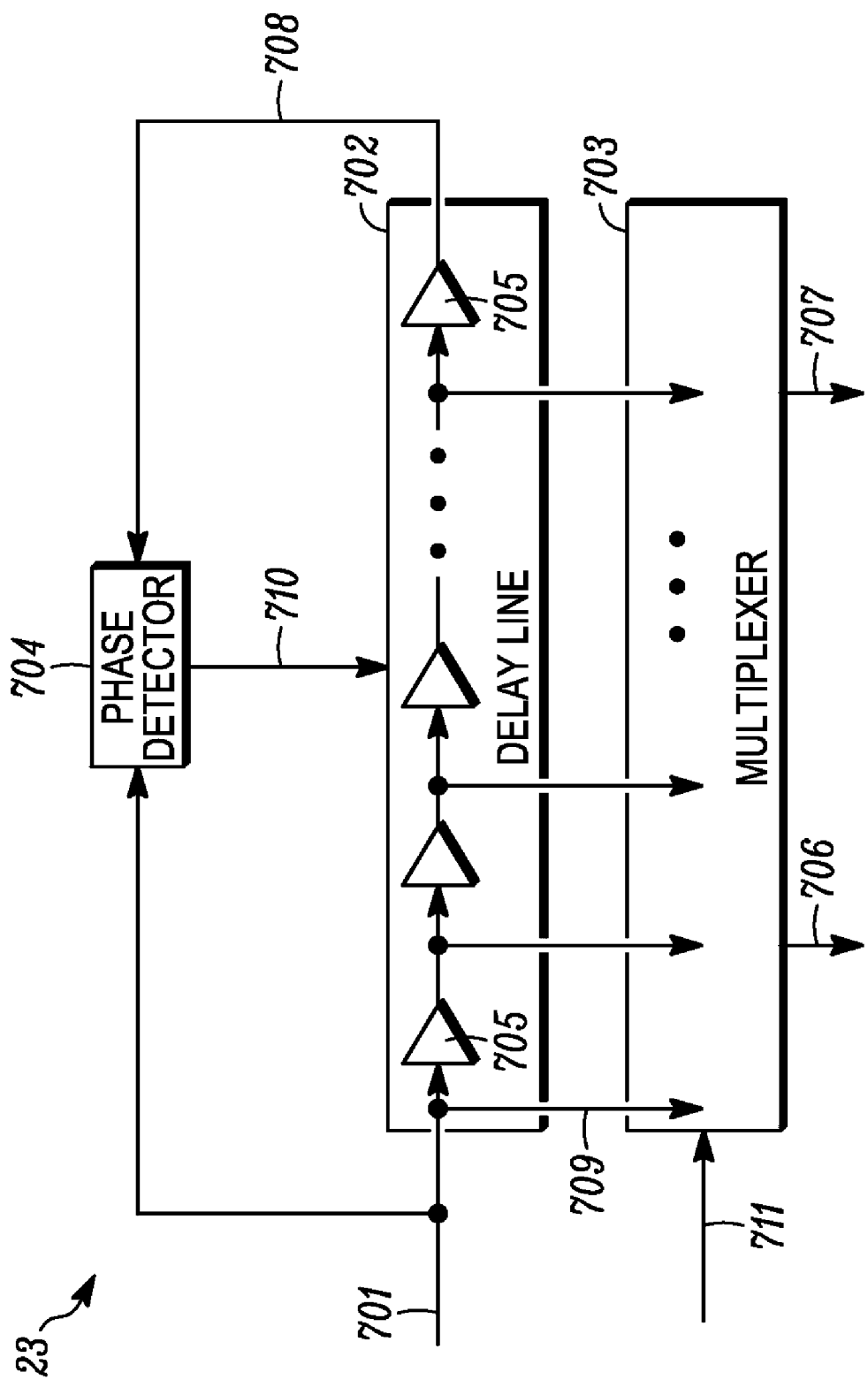
FIG. 7 is a block diagram of a Delay Locked Loop in accordance with some embodiments.

Referring now to FIG. 7, there is shown a block diagram of the DLL 23 in accordance with some embodiments, including a multiplexer 703, a delay line 702, and a phase detector 704. Operationally in the embodiment of FIG. 7, a coarse phase shifted LO signal 701 is fed into the delay line 702. The delay line 702 comprises a series of delay elements 705. The series of delay elements 705 apply a fine phase shift to the coarse phase shifted LO signal 701 to generate fine phase shifted LO signals 709. The fine phase shifted LO signals 709 are then fed into the multiplexer 703. The multiplexer 703 selects a first fine phase shifted LO signal 706 and a second fine phase shifted LO signal 707 of the fine phase shifted LO signals 709 based on a control signal 711. The first fine phase shifted LO signal 706 and the second fine phase shifted LO signal 707 are quadrature phase shifted with respect to each other. In one example, the DLL 23 may also include a control logic (not shown in FIG. 7) to generate the control signal 711. The control logic may operate based upon the phase control signal 27 received from the control circuit 28 of previous embodiments.

In the embodiment of FIG. 7, a last delay element of the delay elements 705 may produce an output 708 which is fed into the phase detector 704 along with the coarse phase shifted LO signal 701 to generate a tune signal 710. The tune signal 710 is then fed into the delay line 702 to control the fine phase shift introduced by each delay element 705 of the delay line 702. In one example, the phase detector 704 may also be known as a phase detector low pass filter 704.

The delay line 702 may be a N tap delay line comprising N delay elements 705, where N is determined by a phase resolution of the programmable divider 24, and the required phase accuracy of the first fine phase shifted LO signal 706 and the second fine phase shifted LO signal 707. The phase resolution of the programmable divider 24 as seen in previous embodiments may be $360/(f_{vco}/f_o)$. In one example, the multiplexer may be a N to 1 multiplexer.

Figure 8:
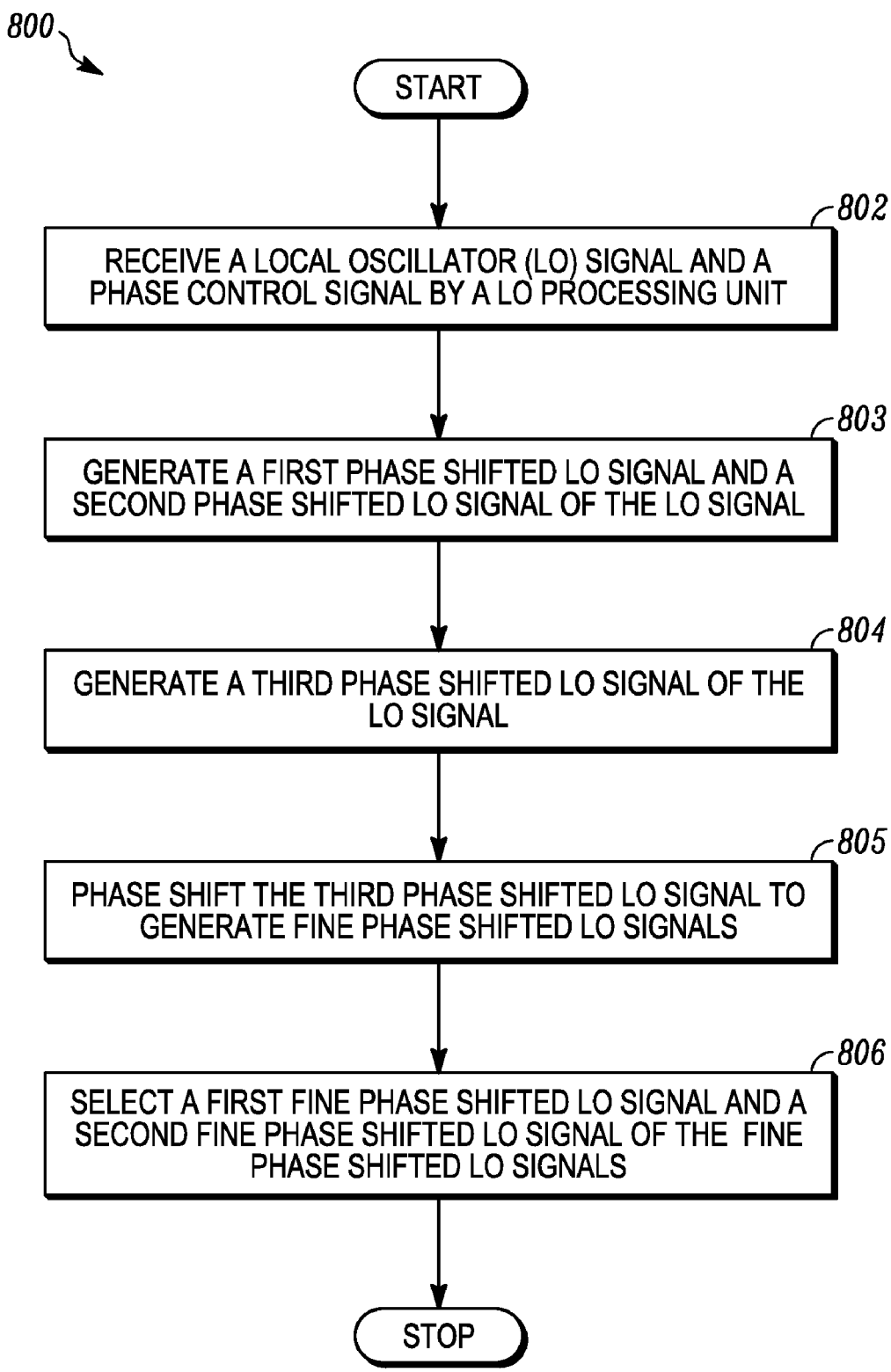
FIG. 8 is a flowchart of a method of generating phase shifted local oscillator signals for a feedback loop in a transmitter, in accordance with some embodiments.

Referring now to FIG. 8, there is shown a flowchart of a method 800 of generating phase shifted local oscillator (LO) signals for a feedback loop in a transmitter in accordance with some embodiments. The method 800 is described with reference to FIG. 1.

At step 802, a LO signal and a phase control signal are received by a LO processing unit, e.g. the LO processing unit 29. In one example, the LO signal may be generated by an oscillator e.g. the oscillator 26. In this case, the oscillator may operate at a frequency $f_{vco}$. The phase control signal may be generated by a control circuit, e.g. the control circuit 28. The LO processing unit may comprise a programmable divider, e.g. the programmable divider 24 and a delay locked loop (DLL), e.g. the DLL 23.

At step 803, a first phase shifted LO signal and a second phase shifted LO signal are generated by the programmable divider. In one example, after receiving the LO signal 25 the programmable divider 24 modifies the frequency fvco of the LO signal by a factor 1/X to generate a LO signal having a frequency $f_{vco}/X$. The first and the second phase shifted LO signals are generated having the frequency $f_{vco}/X$ and a quadrature phase shift with respect to each other. The generated first phase shifted LO signal and the second phase shifted LO signal are then applied to a modulator, e.g. the modulator 517, to generate a modulated output signal. Further, at step 804, a third phase shifted LO signal is generated by the programmable divider by applying a coarse phase shift to the LO signal. The third phase shifted LO signal is then fed into the DLL, whereby the DLL phase shifts the third phase shifted LO signal to generate fine phase shifted LO signals at step 805.

At step 806, a first fine phase shifted LO signal and a second fine phase shifted LO signal are selected of the fine phase shifted LO signals based upon a phase control signal. The first fine phase shifted LO signal and the second fine phase shifted LO signal are in quadrature phase shift with respect to each other. The first fine phase shifted LO signal and the second fine phase shifted LO signal are then applied to a demodulator, e.g. the demodulator 523, along with a feedback signal coupled from a transmitter output signal to generate an inphase demodulated signal and a quadrature demodulated signal.

Figure 9:
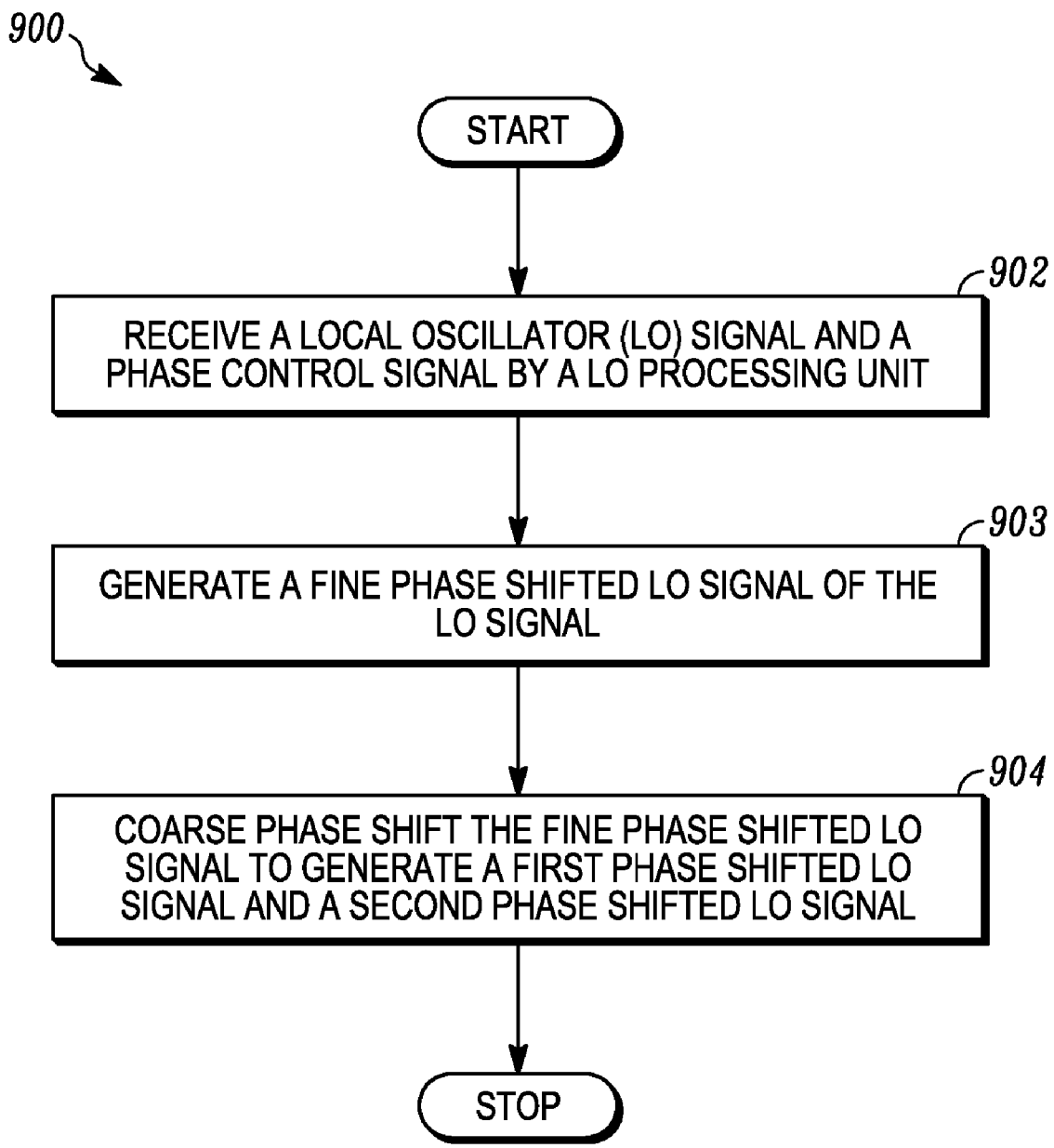
FIG. 9 is a flowchart of a method of generating phase shifted local oscillator signals for a feedback loop in a transmitter, in accordance with some embodiments.

Referring now to FIG. 9, there is shown a flowchart of a method 900 of generating phase shifted local oscillator (LO) signals for a feedback loop in a transmitter in accordance with some embodiments. The method 900 is described with reference to FIG. 2.

At step 902, the LO processing unit receives the LO signal and the phase control signal. At step 903, the DLL generates a fine phase shifted LO signal from the LO signal by applying the fine phase shift to the LO signal. The fine phase shifted LO signal is then fed into the programmable divider. In one example, after receiving the fine phase shifted LO signal the programmable divider modifies the frequency $f_{vco}$ of the fine phase shifted LO signal by a factor 1/X to generate phase shifted signals having the frequency $f_{vco}/X$. In one example, the phase shifted signals may also include the fine phase shifted LO signal having the frequency $f_{vco}/X$. Further, at step 904, the fine phase shifted LO signal is coarse phase shifted by the programmable divider to generate a first phase shifted LO signal and a second phase shifted LO signal having a frequency $f_{vco}/X$. The first phase shifted LO signal and the second phase shifted LO signal are in quadrature phase shift with respect to each other. The first phase shifted LO signal and the second phase shifted LO signal are applied to the demodulator along with a feedback signal coupled from a transmitter output signal to generate an inphase demodulated signal and a quadrature demodulated signal.

Figure 10:
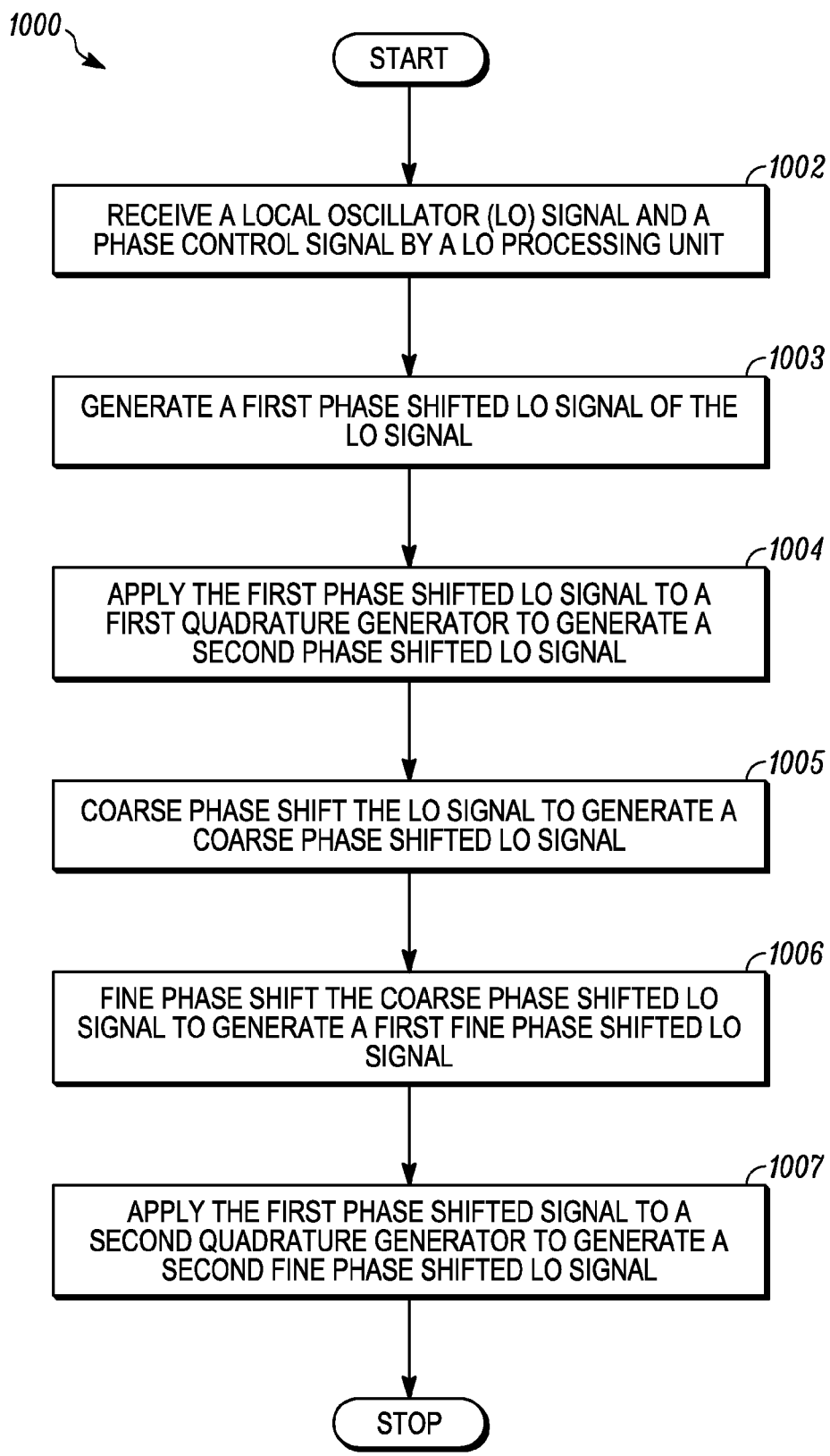
FIG. 10 is a flowchart of a method of generating phase shifted local oscillator signals for a feedback loop in a transmitter, in accordance with some embodiments.

Referring now to FIG. 10, there is shown a flowchart of a method 1000 of generating phase shifted local oscillator (LO) signals for a feedback loop in a transmitter in accordance with some embodiments. The method 1000 is described with reference to FIG. 3.

At step 1002, the LO signal and the phase control signal are received by the LO processing unit. At step 1003, a first phase shifted LO signal is generated by the programmable divider. In one example, after receiving the LO signal the programmable divider modifies the frequency $f_{vco}$ of the LO signal by a factor 1/X to generate a LO signal having a frequency $f_{vco}/X$. At step 1004, the first phase shifted LO signal is then applied to a first quadrature generator, e.g. the first quadrature generator 50. The first quadrature generator quadrature phase shifts the first phase shifted LO signal to generate a second phase shifted LO signal. Further, the first phase shifted LO signal and the second phase shifted LO signal are applied to the modulator to generate a modulated output signal.

At step 1005, the programmable divider applies the coarse phase shift to the LO signal having the frequency $f_{vco}/X$ to generate a coarse phase shifted LO signal. At step 1006, the coarse phase shifted LO signal is fine phase shifted by the DLL to generate a first fine phase shifted LO signal. At step 1007, the first fine phase shifted LO signal is applied to a second quadrature generator, e.g. the quadrature generator 51, to generate a second fine phase shifted LO signal. The first fine phase shifted LO signal and the second fine phase shifted LO signal are applied to the demodulator along with a feedback signal coupled from a transmitter output signal to generate an inphase demodulated signal and a quadrature demodulated signal.

Figure 11:
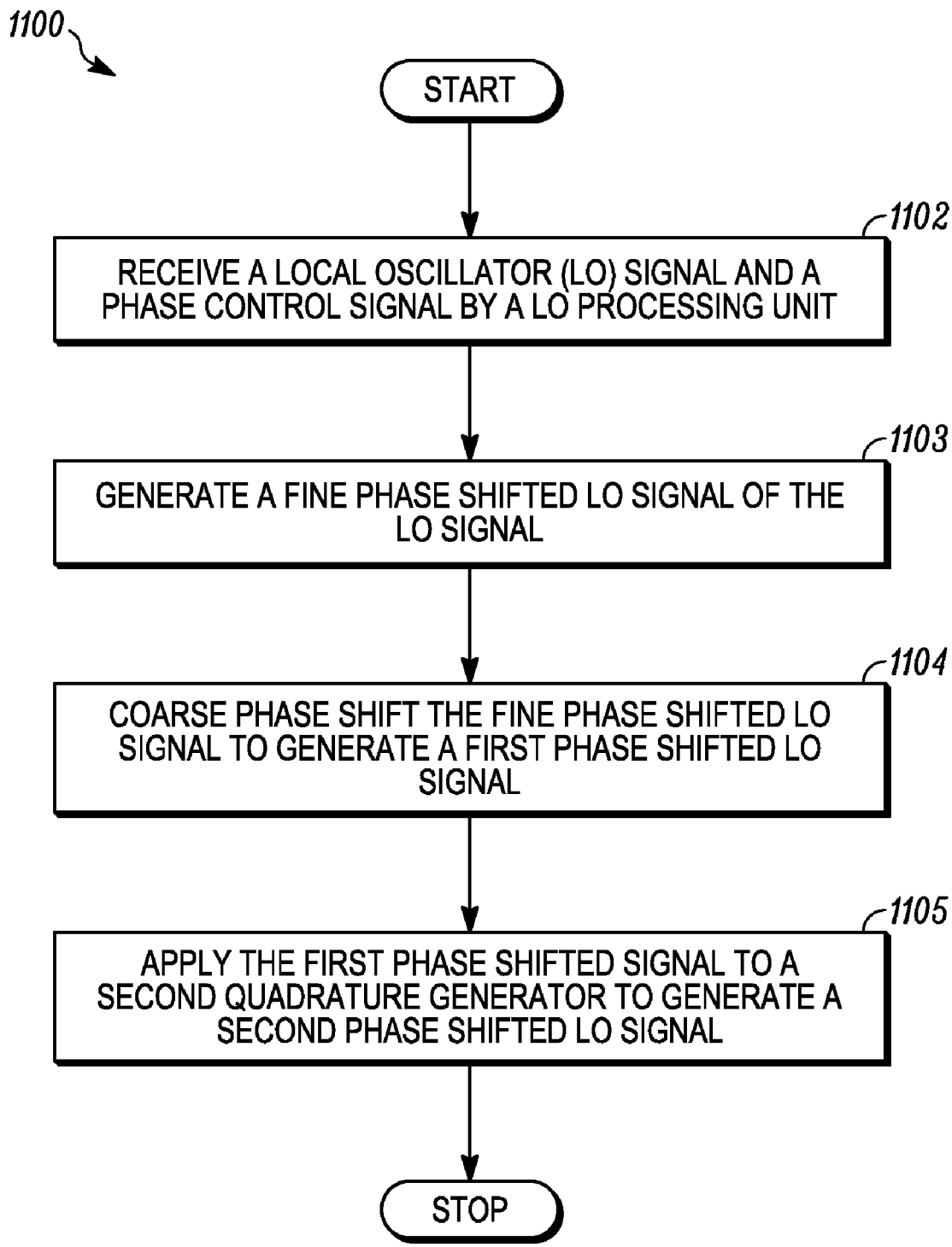
FIG. 11 is a flowchart of a method of generating phase shifted local oscillator signals for a feedback loop in a transmitter, in accordance with some embodiments.

Referring now to FIG. 11, there is shown a flowchart of a method 1100 of generating phase shifted local oscillator (LO) signals for a feedback loop in a transmitter in accordance with some embodiments. The method 800 is described with reference to FIG. 4.

At step 1102, a LO signal and a phase control signal are received by the LO processing unit. At step 1103, a fine phase shifted LO signal at a frequency $f_{vco}$ is generated by the DLL by applying the fine phase shift to the LO signal. The fine phase shifted LO signal is then fed into the programmable divider. Further, at step 1104, the fine phase shifted LO signal is coarse phase shifted by the programmable divider to generate a first phase shifted LO signal. In one example, after receiving the fine phase shifted LO signal the programmable divider modifies a frequency $f_{vco}$ of the fine phase shifted LO signal by a factor 1/X to generate phase shifted signals having the frequency $f_{vco}/X$. In one example, the phase shifted signals may also include the fine phase shifted LO signal having the frequency $f_{vco}/X$.

At step 1105, the first phase shifted LO signal is applied to a second quadrature generator to generate a second phase shifted LO signal. The first phase shifted LO signal and the second phase shifted LO signal are in quadrature phase shift with respect to each other. The first fine phase shifted LO signal and the second fine phase shifted LO signal are applied to the demodulator along with a feedback signal coupled from a transmitter output signal to generate an inphase demodulated signal and a quadrature demodulated signal.

Accordingly, there has been provided a transmitter with an adjustable feedback loop that maintains transmitter linearity over a broad range of frequencies. The transmitter comprises a local oscillator (LO) processing unit for generating phase shifted LO signals. The LO processing unit comprises a programmable divider for coarse phase shifting the LO signals and at least one delay locked loop (DLL) for fine phase shifting the LO signals to generate phase shifted LO signals. The phase shifted LO signals are then fed into a demodulator for generating demodulated signals for feedback.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method of generating phase shifted local oscillator signals for a Cartesian feedback loop in a transmitter, comprising:
   receiving a local oscillator (LO) signal and a phase control signal by a LO processing unit, the LO processing unit comprising a programmable divider and at least one delay locked loop (DLL), the LO processing unit adjusting a loop phase in a time domain for the Cartesian feedback loop in the transmitter by:
   generating a first phase shifted LO signal and a second phase shifted LO signal from the LO signal, the second phase shifted LO signal substantially in phase quadrature to the first phase shifted LO signal, and applying the first phase shifted LO signal and the second phase shifted LO signal to a modulator;
   generating a third phase shifted LO signal from the LO signal, the third phase shifted LO signal having a coarse phase shift;
   phase shifting the third phase shifted LO signal to generate fine phase shifted LO signals each having a fine phase shift; and
   selecting a first fine phase shifted LO signal and a second fine phase shifted LO signal of the fine phase shifted LO signals, the second fine phase shifted LO signal substantially in phase quadrature to the first fine phase shifted LO signal, and applying the first fine phase shifted LO signal and the second fine phase shifted LO signal to a demodulator, thereby maintaining stability of the transmitter via time domain phase adjustments in the Cartesian feedback loop.

2. The method of claim 1, wherein applying the first phase shifted LO signal and the second phase shifted LO signal to the modulator further comprises applying the first phase shifted LO signal and the second phase shifted LO signal to the modulator to generate a modulated output signal.

3. The method of claim 2 further comprising, applying the modulated output signal to a power amplifier to generate a transmitter output signal.

4. The method of claim 3, wherein applying the first fine phase shifted LO signal and the second fine phase shifted LO signal to the demodulator further comprises applying the first fine phase shifted LO signal and the second fine phase shifted LO signal to the demodulator along with a feedback signal coupled from the transmitter output signal to generate an inphase demodulated signal and a quadrature demodulated signal.

5. The method of claim 3, wherein the LO signal has a frequency $f_{vco} = Xf_o$, wherein X is an integer value and $f_o$ is a frequency of the transmitter output signal.

6. The method of claim 5 further comprising, modifying the frequency of the LO signal by a factor 1/X to generate a LO signal having a frequency $f_{vco}/X$, before the first phase shifted LO signal and the second phase shifted LO signal are generated.

7. The method of claim 6, wherein the coarse phase shift is within $360°/(f_{vco}/f_o)$ of a phase value determined during a training mode.

8. The method of claim 7, wherein the fine phase shift is based upon the phase value determined during the training mode.

9. A transmitter, comprising: a modulator; a demodulator; a programmable divider and at least one delay locked loop (DLL) provided in a path between the modulator and the demodulator thereby forming a Cartesian feedback loop, the programmable divider and the at least one DLL generating adjustable phase shifted local oscillator (LO) signals in the time domain to maintain Cartesian feedback loop stability of the transmitter; and a power amplifier coupled to the modulator for generating a linear transmitter output signal in response to the adjustable phase shifted LO signals; wherein the programmable divider for generating phase shifted LO signals further comprises coarse phase shifting a LO signal to generate a coarse phase shifted LO signal; wherein the at least one DLL for fine phase shifting the coarse phase shifted LO signal to generate a first fine phase shifted LO signal and a second fine phase shifted LO signal, the second fine phase shifted LO signal substantially in phase quadrature to the first fine phase shifted LO signal.

10. The transmitter of claim 9, the demodulator for receiving the first fine phase shifted LO signal, the second fine phase shifted LO signal, and a feedback signal coupled from the transmitter output signal.

11. The transmitter of claim 10, the demodulator for generating an inphase demodulated signal and a quadrature demodulated signal.

* * * * *

UNITED STATES PATENT AND TRADEMARK OFFICE
CERTIFICATE OF CORRECTION

PATENT NO. : 8,059,777 B2  Page 1 of 1
APPLICATION NO. : 11/941281
DATED : November 15, 2011
INVENTOR(S) : Wilhite et al.

It is certified that error appears in the above-identified patent and that said Letters Patent is hereby corrected as shown below:

On the Title Page, in item (54) and Column 1, Line 4, in Title, delete "ON" and insert -- IN --, therefor.

In Column 1, Line 6, delete "INVENTION" and insert -- DISCLOSURE --, therefor.

Signed and Sealed this
Fourth Day of December, 2012

David J. Kappos
*Director of the United States Patent and Trademark Office*